(12) United States Patent
Luce et al.

(10) Patent No.: US 7,585,758 B2
(45) Date of Patent: Sep. 8, 2009

(54) INTERCONNECT LAYERS WITHOUT ELECTROMIGRATION

(75) Inventors: Stephen Ellinwood Luce, Underhill, VT (US); Thomas Leddy McDevitt, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 11/556,802

(22) Filed: Nov. 6, 2006

(65) Prior Publication Data

US 2008/0105977 A1    May 8, 2008

(51) Int. Cl.
*H01L 21/4763* (2006.01)
(52) U.S. Cl. .................. 438/597; 438/618; 438/620; 438/622; 438/638; 438/643; 257/E21.576; 257/E21.577; 257/E21.579; 257/E21.589; 257/E23.167
(58) Field of Classification Search .............. 438/637, 438/597, 618, 620, 622, 628, 631, 633, 638, 438/639, 643, 675, 687; 257/E21.004, 169, 257/576, 577, 579, 589, 591, E23.167, E27.047
See application file for complete search history.

(56) References Cited

U.S. PATENT DOCUMENTS

| | | | |
|---|---|---|---|
| 5,904,565 A * | 5/1999 | Nguyen et al. | 438/687 |
| 6,177,342 B1 * | 1/2001 | Lee et al. | 438/638 |
| 6,180,523 B1 * | 1/2001 | Lee et al. | 438/678 |
| 6,218,302 B1 * | 4/2001 | Braeckelmann et al. | 438/687 |
| 6,221,757 B1 * | 4/2001 | Schmidbauer et al. | 438/625 |
| 6,342,448 B1 * | 1/2002 | Lin et al. | 438/687 |
| 6,359,328 B1 * | 3/2002 | Dubin | 257/622 |
| 6,503,827 B1 * | 1/2003 | Bombardier et al. | 438/631 |
| 6,541,374 B1 * | 4/2003 | de Felipe et al. | 438/648 |
| 6,809,032 B1 * | 10/2004 | Mauersberger et al. | 438/692 |
| 6,833,604 B2 * | 12/2004 | Tsau | 257/532 |
| 6,852,635 B2 | 2/2005 | Satta et al. | |
| 6,882,052 B2 * | 4/2005 | Murphy | 257/751 |
| 6,908,851 B2 | 6/2005 | Leng et al. | |
| 6,911,389 B2 * | 6/2005 | Brennan et al. | 438/622 |
| 7,033,930 B2 * | 4/2006 | Kozhukh et al. | 438/643 |
| 7,105,928 B2 * | 9/2006 | Yu et al. | 257/774 |
| 7,112,286 B2 * | 9/2006 | Vialpando et al. | 216/18 |
| 7,132,363 B2 * | 11/2006 | Yang et al. | 438/639 |
| 7,176,119 B2 * | 2/2007 | Gambino et al. | 438/622 |
| 7,250,334 B2 * | 7/2007 | Crenshaw et al. | 438/239 |
| 2001/0055840 A1 * | 12/2001 | Verret | 438/142 |
| 2002/0041030 A1 * | 4/2002 | Kim et al. | 257/758 |
| 2002/0192938 A1 * | 12/2002 | Wada et al. | 438/618 |
| 2003/0232494 A1 | 12/2003 | Adams et al. | |

(Continued)

*Primary Examiner*—Michael S Lebentritt
(74) *Attorney, Agent, or Firm*—Schmeiser, Olsen & Watts; William D. Sabo

(57) ABSTRACT

A structure and a method for forming the same. The structure includes (a) an interlevel dielectric (ILD) layer; (b) a first electrically conductive line and a second electrically conductive line both residing in the ILD layer; (c) a diffusion barrier region residing in the ILD layer. The diffusion barrier region (i) physically isolates, (ii) electrically couples together, and (iii) are in direct physical contact with the first and second electrically conductive lines. The first and second electrically conductive lines each comprises a first electrically conductive material. The diffusion barrier region comprises a second electrically conductive material different from the first electrically conductive material. The diffusion barrier region is adapted to prevent a diffusion of the first electrically conductive material through the diffusion barrier region.

8 Claims, 12 Drawing Sheets

U.S. PATENT DOCUMENTS

| | | |
|---|---|---|
| 2004/0124537 A1 | 7/2004 | Takayama et al. |
| 2005/0148209 A1 | 7/2005 | Chu et al. |
| 2005/0170653 A1 | 8/2005 | Horiuchi et al. |
| 2006/0027526 A1* | 2/2006 | Vialpando et al. ............. 216/13 |
| 2006/0027930 A1 | 2/2006 | Edelstein et al. |
| 2006/0145296 A1* | 7/2006 | Coolbaugh et al. .......... 257/536 |
| 2006/0205204 A1* | 9/2006 | Beck .......................... 438/628 |
| 2007/0254449 A1* | 11/2007 | Coolbaugh et al. .......... 438/382 |

* cited by examiner

INTERCONNECT LAYERS WITHOUT ELECTROMIGRATION

FIELD OF THE INVENTION

The present invention relates to structures, and more specifically, to structures preventing the creation of void fails.

BACKGROUND OF THE INVENTION

In conventional semiconductor structures, there are flux divergence points in wires and vias which act as nucleation points for electromigration-induced voiding in damascene and dual-damascene wiring. These flux divergence points result in void fails in the wires and the vias when current density in the wires and the vias exceed a certain maximum value. Therefore, there is a need for a semiconductor structure (and a method for forming the same) preventing the creation of void fails in the wires and the vias when there is no intentional interface between the via and underlying wire.

SUMMARY OF THE INVENTION

The present invention provides a structure, comprising (a) an interlevel dielectric (ILD) layer; (b) a first electrically conductive line and a second electrically conductive line both residing in the ILD layer; (c) a diffusion barrier region residing in the ILD layer, wherein the diffusion barrier region (i) physically isolates, (ii) electrically couples together, and (iii) are in direct physical contact with the first and second electrically conductive lines, wherein the first and second electrically conductive lines each comprises at least a first electrically conductive material, wherein the diffusion barrier region comprises at least a second electrically conductive material different from the first electrically conductive material, and wherein the diffusion barrier region is adapted to prevent a diffusion of the first electrically conductive material through the diffusion barrier region.

The present invention provides a structure, comprising (a) an interlevel dielectric (ILD) layer; (b) a first electrically conductive line and a second electrically conductive line both residing in the ILD layer; (c) a flux relaxation region residing in the ILD layer, wherein the flux relaxation region (i) physically isolates, (ii) electrically couples together, and (iii) are in direct physical contact with the first and second electrically conductive lines, wherein the first and second electrically conductive lines and the flux relaxation region each comprises at least an electrically conductive material, and wherein if an electric current flows from the first electrically conductive line to the second electrically conductive line through the flux relaxation region, then a first resulting current density in the flux relaxation region would be lower than a second resulting current density in each of the first and second electrically conductive lines.

The present invention provides a structure fabrication method, comprising providing a first interlevel dielectric (ILD) layer; and then forming a first electrically conductive line, a second electrically conductive line, and a diffusion barrier region in the first ILD layer, wherein the diffusion barrier region (i) physically isolates, (ii) electrically couples together, and (iii) are in direct physical contact with the first and second electrically conductive lines, wherein the first and second electrically conductive lines each comprises at least a first electrically conductive material, wherein the diffusion barrier region comprises at least a second electrically conductive material different from the first electrically conductive material, and wherein the diffusion barrier region is adapted to prevent a diffusion of the first electrically conductive material through the diffusion barrier region.

The present invention provides a structure (and a method for forming the same) preventing the creation of void fails in the wires and the vias.

DETAILED DESCRIPTION OF THE INVENTION

In one embodiment of the present invention, flux divergence points can be eliminated by employing dual-damascene wires without liner in the bottom of the vias contacting the prior wire level. This results in no liner interface between the vias and underlying wires (as shown in FIG. 1B which shows no liner interface between via 140 and underlying wire 130). Wires fabricated using this method theoretically will have immortal electromigration lifetime (i.e., will never fail due to electromigration) since there are no electron flux divergence points in the wiring. However, there may be extrinsic defects in the wiring, such as partially blocked wires due to particles in the wire, dielectric or polymer interfaces between the via wire, grain boundaries, etc. that may cause early electromigration fails.

Figure 1A:
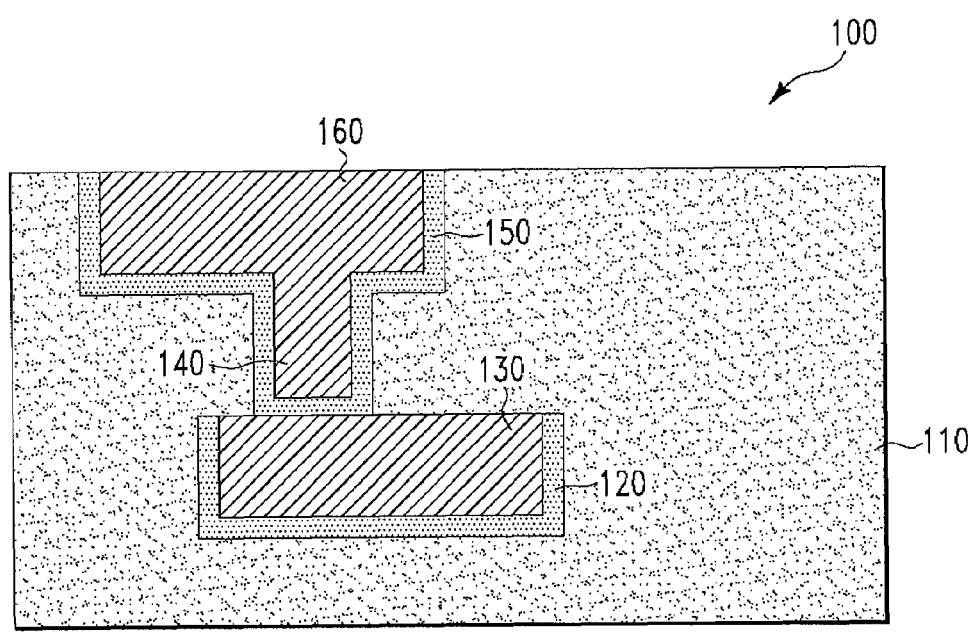
FIGS. 1A-1B show a cross-section view of a first structure, in accordance with embodiments of the present invention.
Figure 1B:
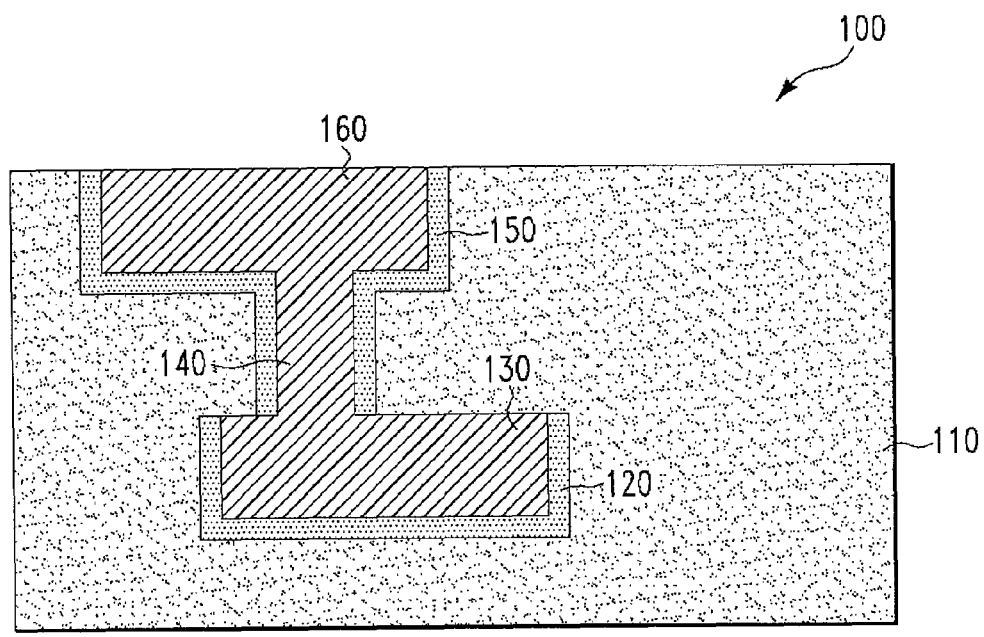

FIG. 1A shows a cross-section view of a first structure 100, in accordance with embodiments of the present invention. More specifically, in one embodiment, with reference to FIG. 1, the wiring structure 100 comprises a dielectric layer 110, wires 130 and 160, and liner regions 120 and 150. Illustratively, the structure 100 further comprises a bottom via 140. More specifically, a bottom via is a via having liner region at its bottom; whereas a bottomless via is a via without liner region at its bottom. The via 140 is a bottom via because the via 140 has a portion of the liner region 150 directly beneath it. In one embodiment, the wires 130 and 160 and the bottom via 140 comprise copper. Illustratively, the liner regions 120 and 150 comprise tantalum nitride. In one embodiment, the wires 130 and 160 are electrically connected with each other through the bottom via 140.

FIG. 1B shows another embodiment of the first structure 100. Illustratively, the structure 100 of FIG. 1B is similar to the structure 100 of FIG. 1A, except that the via 140 of FIG. 1B is a bottomless via (because no portion of the liner region 150 is directly beneath it. The liner at the via bottom could be eliminated, for example, by depositing a liner dep process whose thickness decreases with increasing aspect ratio, followed by a argon sputter step. If the liner thickness before the argon sputter step in a high aspect ratio via bottom and lower aspect ratio wire trough bottom were 10 nm and 30 nm, respectively; and the argon sputter removal was 15 nm, then there would be no liner left in the via bottom and 15 nm of liner left in the wire trough bottom. Alternatively, the liner in the via bottom could be removed with a separate masking and etching step.

FIGS. 2A-7 illustrate a fabrication process for forming a second structure 200, in accordance with embodiments of the present invention. More specifically, in one embodiment, the fabrication process for forming the second structure 200 starts with the structure 200 of FIG. 2A (top-down view) which includes an interlevel dielectric layer (ILD) 210.

Figure 2A:
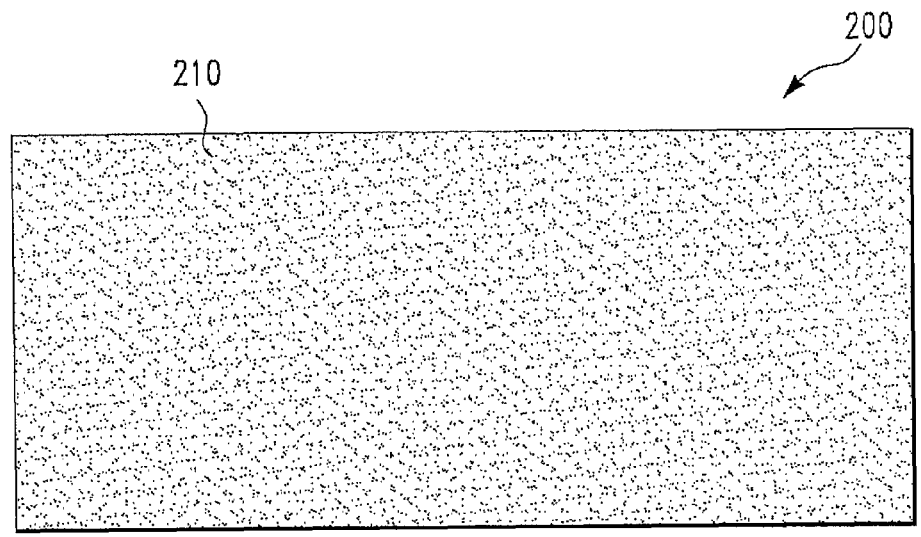
FIGS. 2A-7 illustrate a fabrication process for forming a second structure, in accordance with embodiments of the present invention.
Figure 2B:
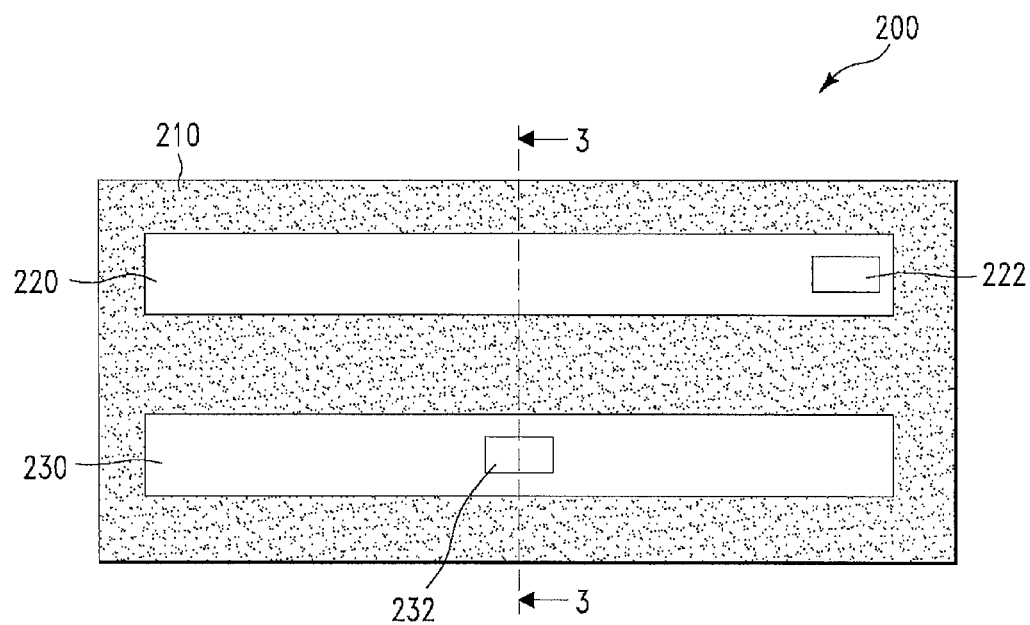

Next, with reference to FIG. 2B, in one embodiment, trenchs 220 and 230 are formed in the ILD layer 210. Illustratively, the trenches 220 and 230 are formed by a conventional damascene method until underlying vias (not shown) that connect to devices (not shown) below are exposed to the surrounding ambient. It should be noted that dielectric portions 222 and 232 of the ILD layer 210 in the trenches 220 and 230 can be referred to as dielectric islands 222 and 232, respectively, as can be seen in FIG. 2B.

Figure 3:
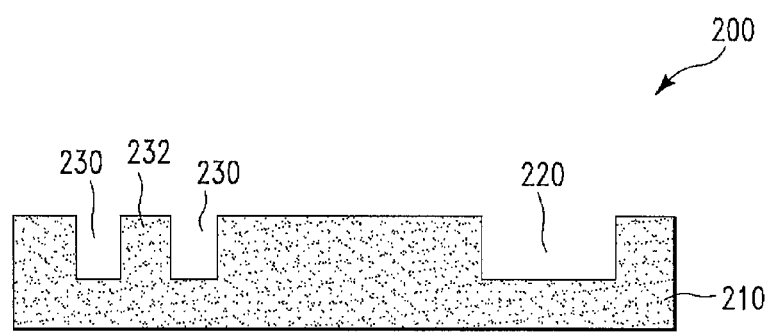

FIG. 3 illustrates a cross-section view of the structure 200 of FIG. 2B along a line 3-3.

Figure 4:
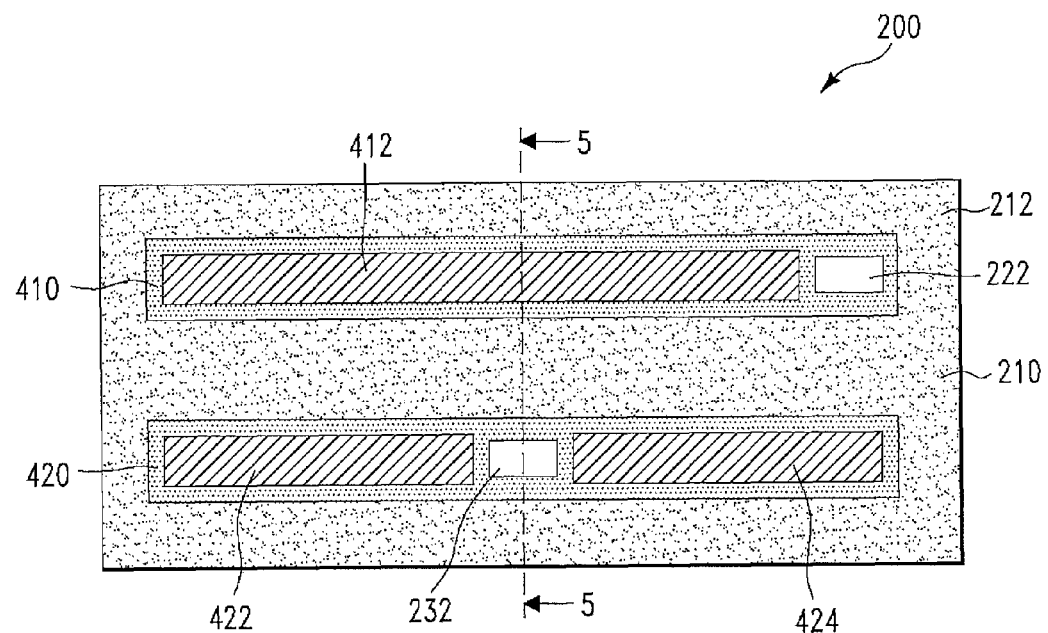

Next, with reference to FIG. 4, in one embodiment, liner regions 410 and 420 are formed on side walls and bottom walls of the trenches 220 and 230, respectively. Illustratively, the liner regions 410 and 420 comprise tantalum nitride. Alternatively, liner regions 410 and 420 could comprise bilayer TaN/Ta or any other damascene liner material as known in the art. In one embodiment, the liner regions 410 and 420 can be formed by PVD (physical vapor deposition or CVD (Chemical Vapor Deposition). Next, in one embodiment, copper is deposited over the liner, and then both the liner and copper on top of the dielectric layer 210 are removed by a CMP (Chemical Mechanical Polishing) step until a top surface 212 of the inter dielectric layer 210 is exposed to the surrounding ambient (not shown). The removal of the liner and copper as described above results in the wire regions 412, 422, and 424 as shown in FIG. 4.

Figure 5:
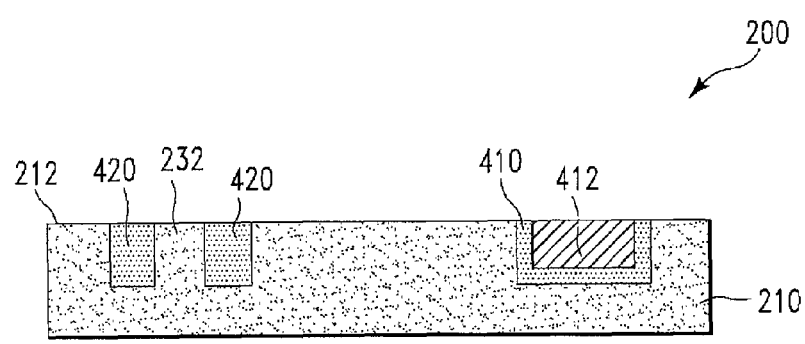

FIG. 5 illustrates a cross-section view of the structure 200 of FIG. 4 along a line 5-5. It should be noted that as a result of the removal of the liner and copper as described above, the liner 420 has pinched off such that the copper wire regions 422 and 424 are physically separated.

Figure 6:
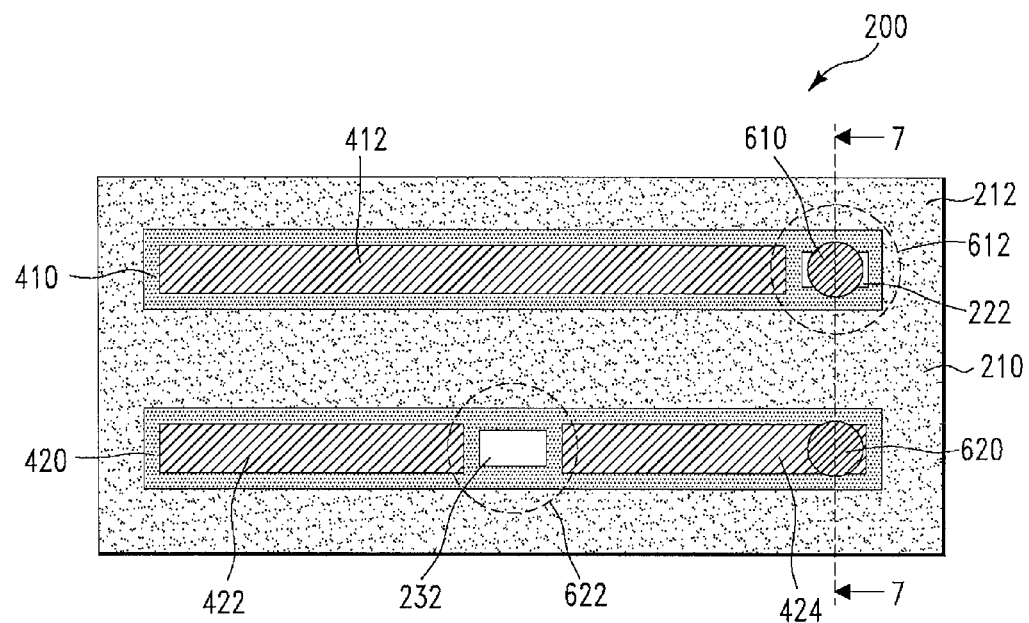

Next, with reference to FIG. 6, in one embodiment, bottomless vias 610 and 620 are formed on top of the structure 200 of FIG. 4. Illustratively, the bottomless vias 610 and 620 comprise copper. In one embodiment, the bottomless vias 610 and 620 can be formed by a conventional method.

Figure 7:
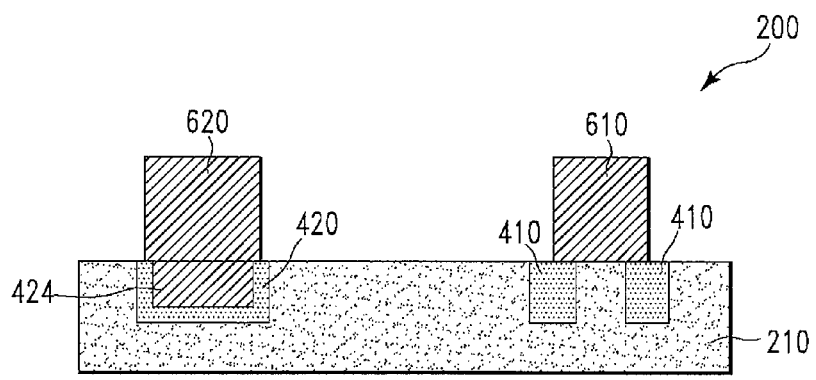

FIG. 7 illustrates a cross-section view of the structure 200 of FIG. 6 along a line 7-7.

As can be seen in FIGS. 6 and 7, it should be noted that the dielectric island 222 and the liner portion on side walls of the dielectric island 222 can be collectively referred to as a flux divergence nucleation point 612. Similarly, the dielectric island 232 and the liner portion on side walls of the dielectric island 232 can be collectively referred to as a flux divergence nucleation point 622. It should be noted that a via can be formed directly on top of a flux divergence nucleation point (as in the case of the via 610 which is formed directly on top of the flux divergence nucleation point 612). Also, a via can be formed not directly on top of a flux divergence nucleation point (as in the case of the via 620 which is formed not directly on top of the flux divergence nucleation point 622). In one embodiment, the flux divergence nucleation points 622 and 612 create the short length effects in the wire regions 422, 424, and 412. These short length effects prevent electromigration from occurring in the wire regions 422, 424, and 412.

Illustratively, the locations of the flux divergence nucleation points 612 and 622 are determined so as to create the short length effects in the wire regions 422, 424, and 412. More specifically, the flux divergence nucleation points 622 and 612 divide the wire regions into pieces which are short enough to not cause void fails. For instance, the flux divergence nucleation points 622 separates the wire region 422 from the wire region 424 such that the lengths of the wire regions 422 and 424 are short enough to create short length effect in the wire regions 422 and 424 preventing electromigration from occurring in the wire regions 422 and 424. In one embodiment, the length of each of the wire regions 412, 422, and 424 is in a range of 50 through 300 micrometers to create the short length effect depending on wire width and thickness.

Figure 8:
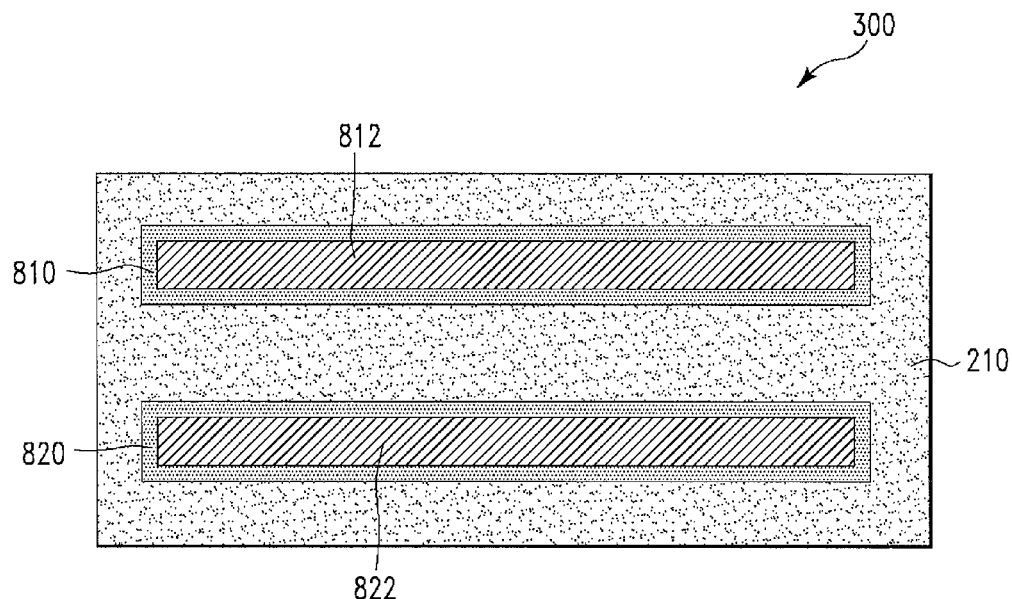
FIGS. 8-9 illustrate a fabrication process for forming a third structure, in accordance with embodiments of the present invention.
Figure 9:
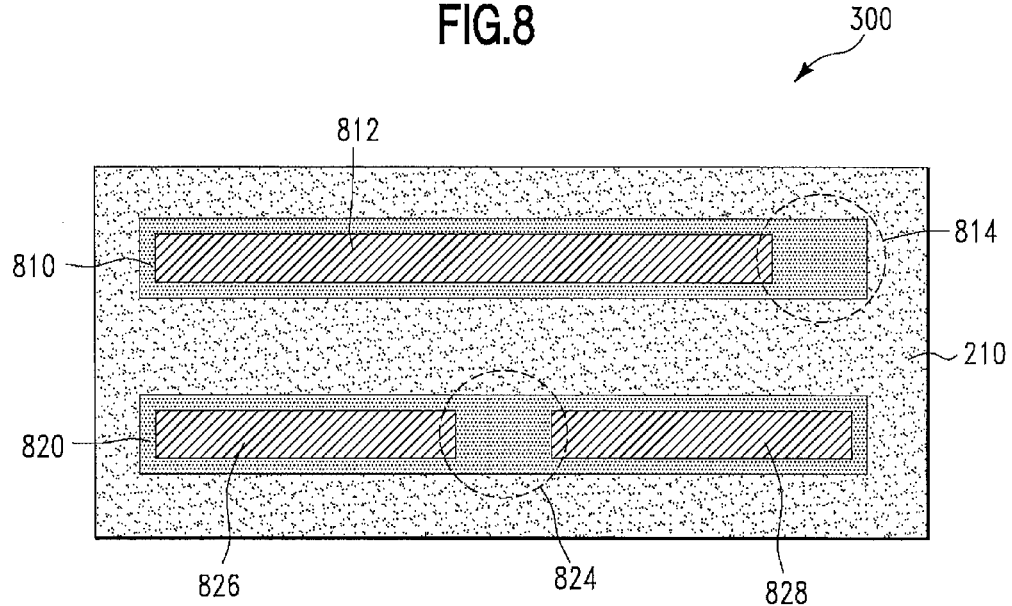

FIGS. 8-9 illustrate a fabrication process for forming a third structure 300, in accordance with embodiments of the present invention. More specifically, in one embodiment, with reference to FIG. 8, the fabrication process of the structure 300 starts with the structure 300 of FIG. 8 (top-down view). Illustratively, the structure 300 comprises an ILD layer 210, wire regions 812 and 822 in the ILD layer 210 wherein the wire regions 812 and 822 are separated from the interlevel dielectric layer 210 by liner regions 810 and 820, respectively. Illustratively, the wire regions 812 and 822 comprise copper and the liner regions 810 and 820 comprise tantalum nitride. In one embodiment, the formation of the structure 300 of FIG. 8 is similar to the formation of the structure 200 of FIG. 4 except that there are no dielectric islands like the dielectric islands 222 and 232 of FIG. 4.

Next, with reference to FIG. 9, in one embodiment, flux divergence nucleation points 814 and 824 are formed in the wire regions 812 and 822 of FIG. 8, respectively. Illustratively, the flux divergence nucleation points 814 and 824 comprise tantalum nitride. In one embodiment, the flux divergence nucleation points 814 and 824 can be formed by a conventional method, such as lithographically patterning the wafer with an opening in regions 814 and 824, etching the copper, removing the photoresist, depositing additional refractory metal, such as TaN, and using CMP to damascene the TaN into trench. Alternatively, a hard mask, such as SiCN deposited using PECVD, could be employed. With the use of a hard mask, the photoresist would be patterned to expose region 814, the hard mask would be etched, the photoresist would be stripped, the copper would be etched using the SiCN hardmask as a masking level, TaN would be deposited, and CMP would be used to planarize the wafer. For illustration, the flux divergence nucleation point 824 divides the wire region 822 of FIG. 8 into wire regions 826 and 828.

Next, with reference to FIG. 9, in one embodiment, a first bottomless via (not shown) is formed on top of the flux divergence nucleation point 814, whereas a second bottomless via (not shown) is formed on top of the wire region 828. Illustratively, the first and second bottomless vias comprise copper. In one embodiment, the first and second bottomless vias can be formed by a conventional method.

As a result, the flux divergence nucleation points 814 and 824 create short length effects in the wire regions 812, 826 and 828 preventing electromigration from occurring in the wire regions 812, 826, and 828.

Figure 10A:
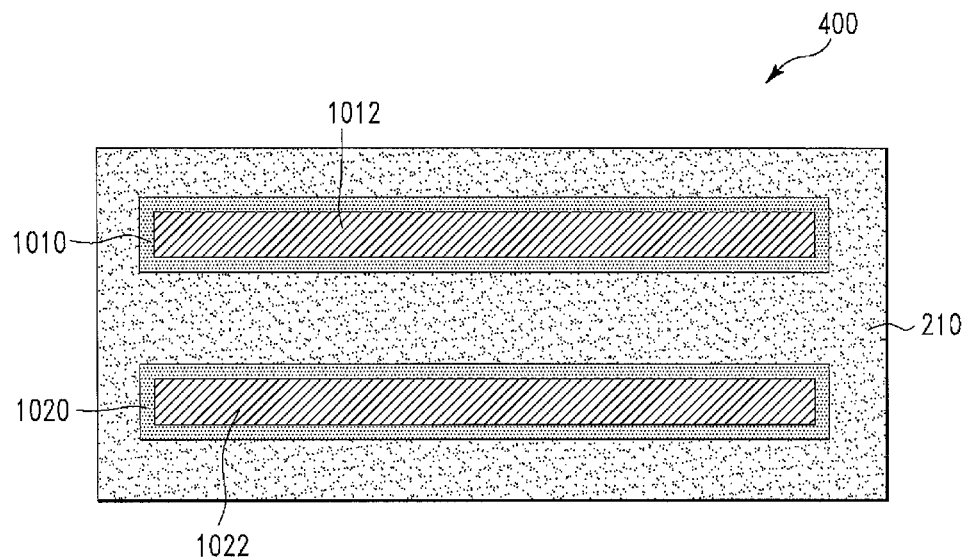
FIGS. 10A-11 illustrate a fabrication process for forming a fourth structure, in accordance with embodiments of the present invention.
Figure 10B:
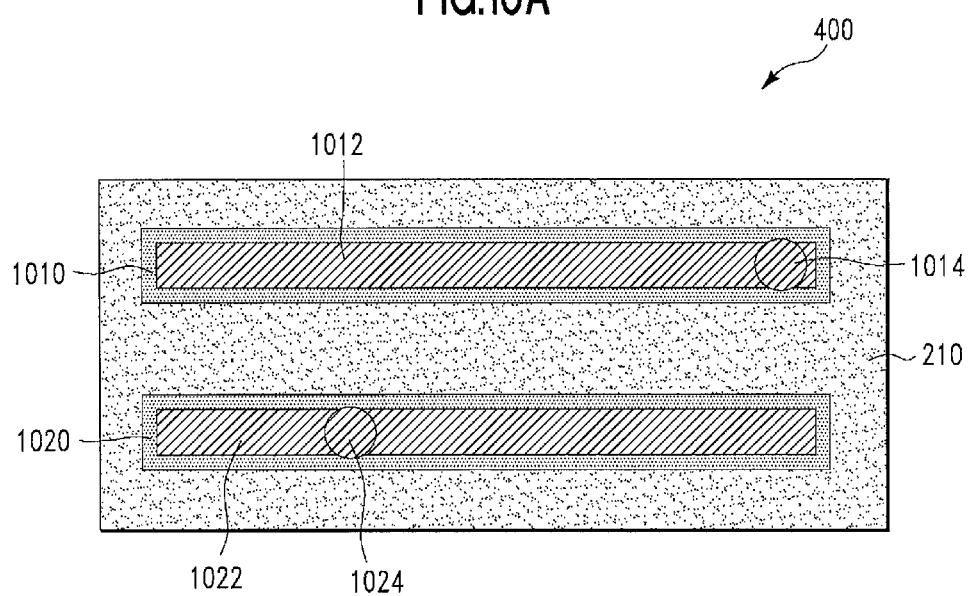
Figure 10C:
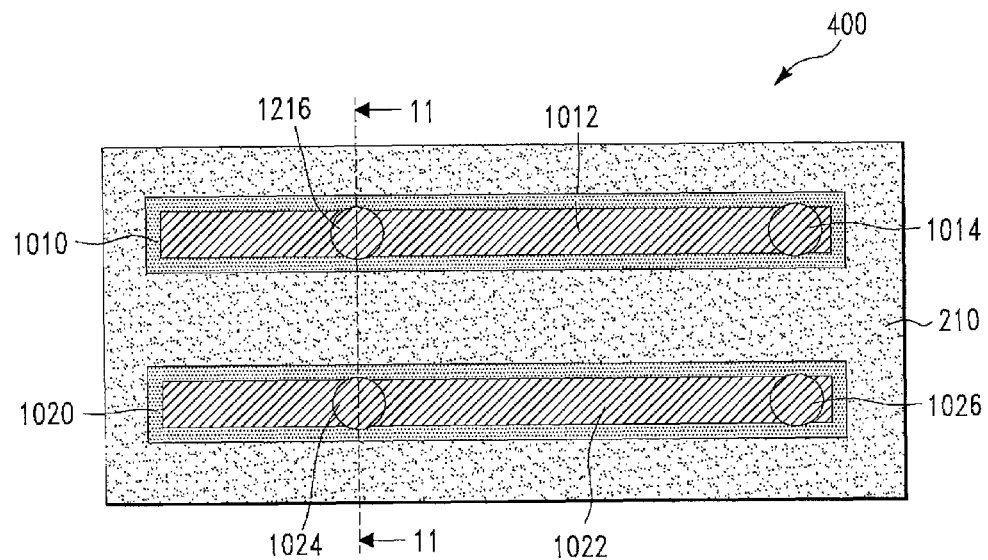
Figure 11:
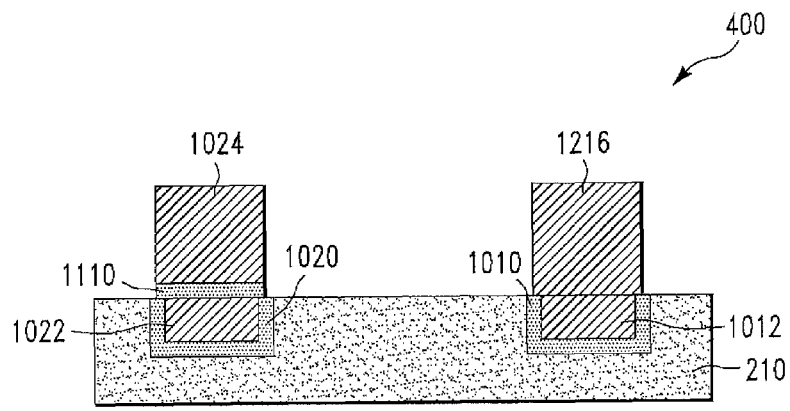

FIGS. 10A-11 illustrate a fabrication process for forming a fourth structure 400, in accordance with embodiments of the present invention. More specifically, in one embodiment, with reference to FIG. 10A, the fabrication process of the structure 400 starts with the structure 400 of FIG. 10A (top-down view). Illustratively, the structure 400 comprises an ILD layer 210, wire regions 1012 and 1022 in the ILD layer 210 wherein the wire regions 1012 and 1022 are separated from the ILD layer 210 by liner regions 1010 and 1020, respectively. Illustratively, the wire regions 1012 and 1022 comprise copper and the liner regions 1010 and 1020 comprise tantalum nitride. In one embodiment, the formation of the structure 400 of FIG. 10A is similar to the formation of the structure 200 of FIG. 4 except that there are no dielectric islands like the dielectric islands 222 and 232 of FIG. 4.

Next, in one embodiment, with reference to FIG. 10B, bottom vias 1014 and 1024 are formed on top of the wire regions 1012 and 1022, respectively. Illustratively, the bottom vias 1014 and 1024 comprise copper. In one embodiment, the bottom vias 1014 and 1024 can be formed by a conventional method. It should be noted that the bottom vias 1014 and 1024 create flux divergence nucleation points at bottom of vias 1014 and 1024.

Next, in one embodiment, with reference to FIG. 10C, bottomless vias 1216 and 1026 are formed on top of the wire regions 1012 and 1022, respectively. Illustratively, the bottomless vias 1216 and 1026 comprise copper. In one embodiment, the bottomless vias 1216 and 1026 can be formed by a conventional method.

FIG. 11 illustrates a cross-section view of the structure 400 of FIG. 10C along a line 11-11.

As a result, the flux divergence nucleation points at bottom of vias 1014 and 1024 create short length effects in the wire regions 1012 and 1022 preventing electromigration from occurring in the wire regions 1012 and 1022.

Figure 12A:
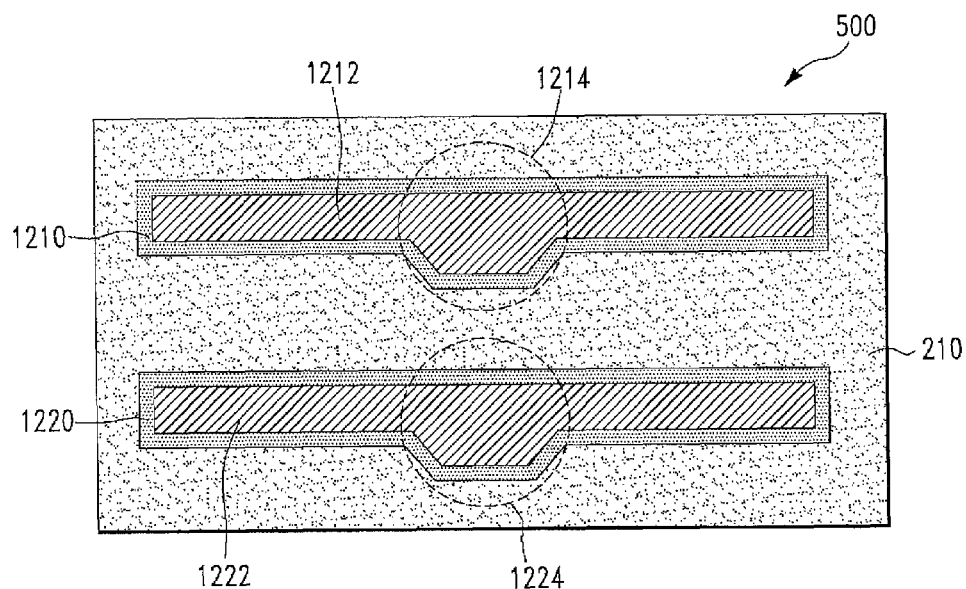
FIGS. 12A-14 illustrate a fabrication process for forming a fifth structure, in accordance with embodiments of the present invention.

FIGS. 12A-14 illustrate a fabrication process for forming a fifth structure 500, in accordance with embodiments of the present invention. More specifically, in one embodiment, with reference to FIG. 12A, the fabrication process of the structure 500 starts with the structure 500 of FIG. 12A (top-down view). Illustratively, the structure 500 comprises an ILD layer 210, wire regions 1212 and 1222 in the ILD layer 210 wherein the wire regions 1212 and 1222 are separated from the ILD layer 210 by liner regions 1210 and 1220, respectively. Illustratively, the wire regions 1012 and 1222 comprise copper and the liner regions 1210 and 1220 comprise tantalum nitride. In one embodiment, the formation of the structure 500 of FIG. 12A is similar to the formation of the structure 200 of FIG. 4 except that there are no dielectric islands like the dielectric islands 222 and 232 of FIG 4.

It should be noted that wide portions of the wire regions 1212 and 1222 can be referred to as flux relaxation points 1214 and 1224, respectively, as can be seen in FIG. 12A. In one embodiment, if an electric current flows through the wire region 1212, then a resulting current density in the flux relaxation point 1214 would be lower than a current density in other portions of the wire region 1212. In one embodiment, if an electric current flows through the wire region 1212, then a resulting current density in the flux relaxation point 1214 would be less than half a current density in other portions of the wire region 1212.

Figure 12B:
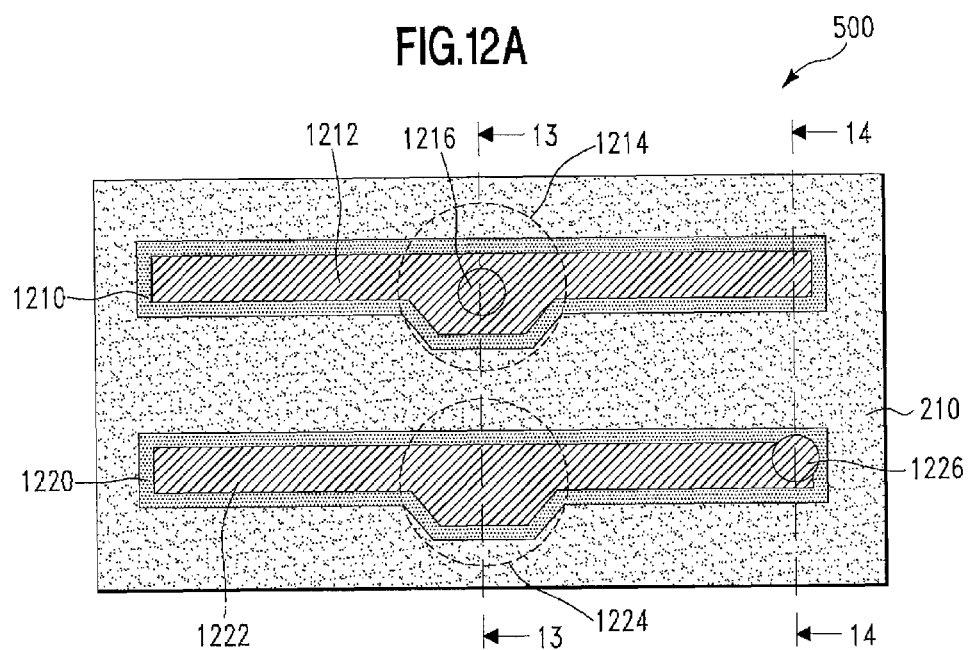
Figure 12B:
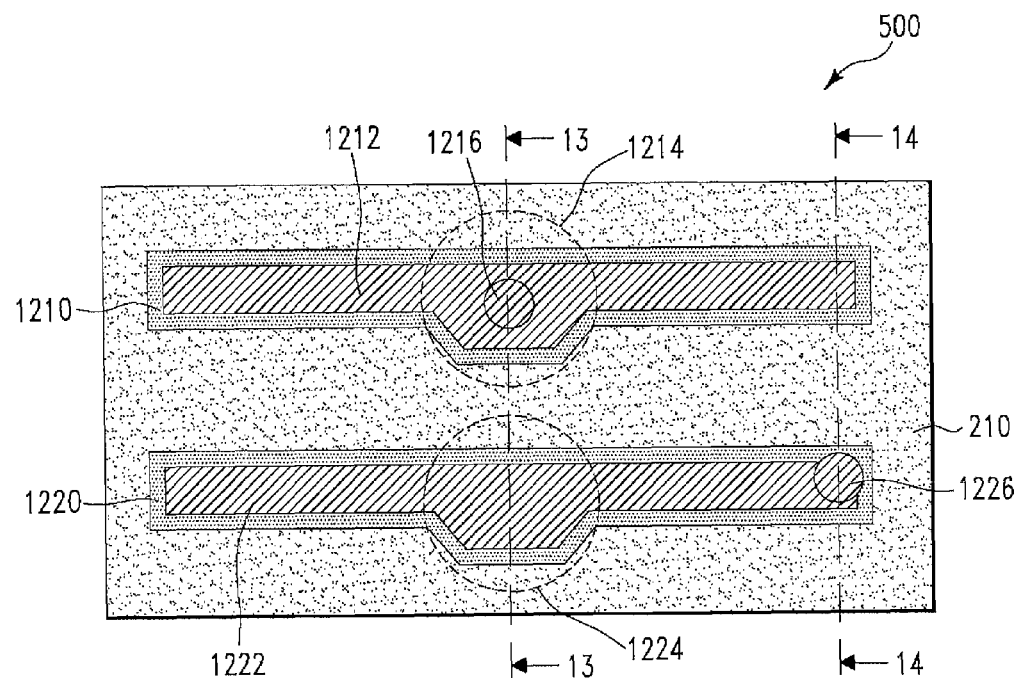

Next, in one embodiment, with reference to FIG. 12B, bottomless vias 1216 is formed on top of the flux relaxation point 1214 whereas bottomless vias 1226 is formed on top of the wire region 1224. Illustratively, the bottomless vias 1216 and 1226 comprise copper. In one embodiment, the bottomless vias 1216 and 1226 can be formed by a conventional method.

Figure 13:
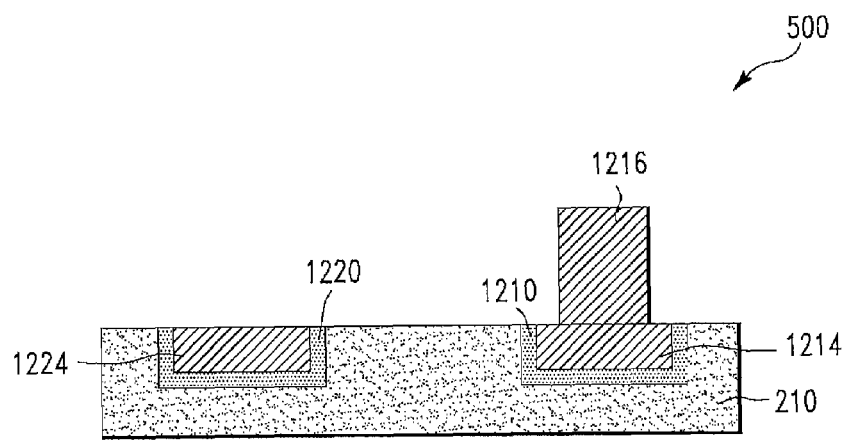

FIG. 13 illustrates a cross-section view of the structure 500 of FIG. 12B along a line 13-13.

Figure 14:
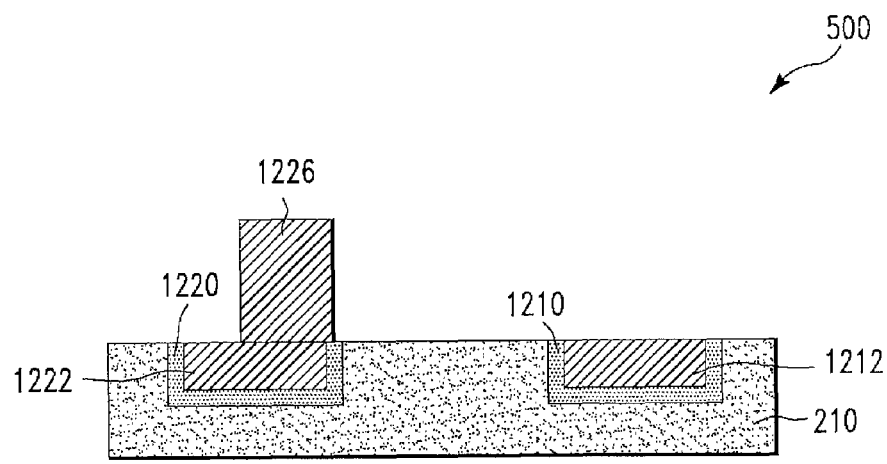

FIG. 14 illustrates a cross-section view of the structure 500 of FIG. 12B along a line 14-14.

As a result, the flux relaxation points 1214 and 1224 prevent the creation of void fails in the wire regions 1212 and 1222.

Figure 15A:
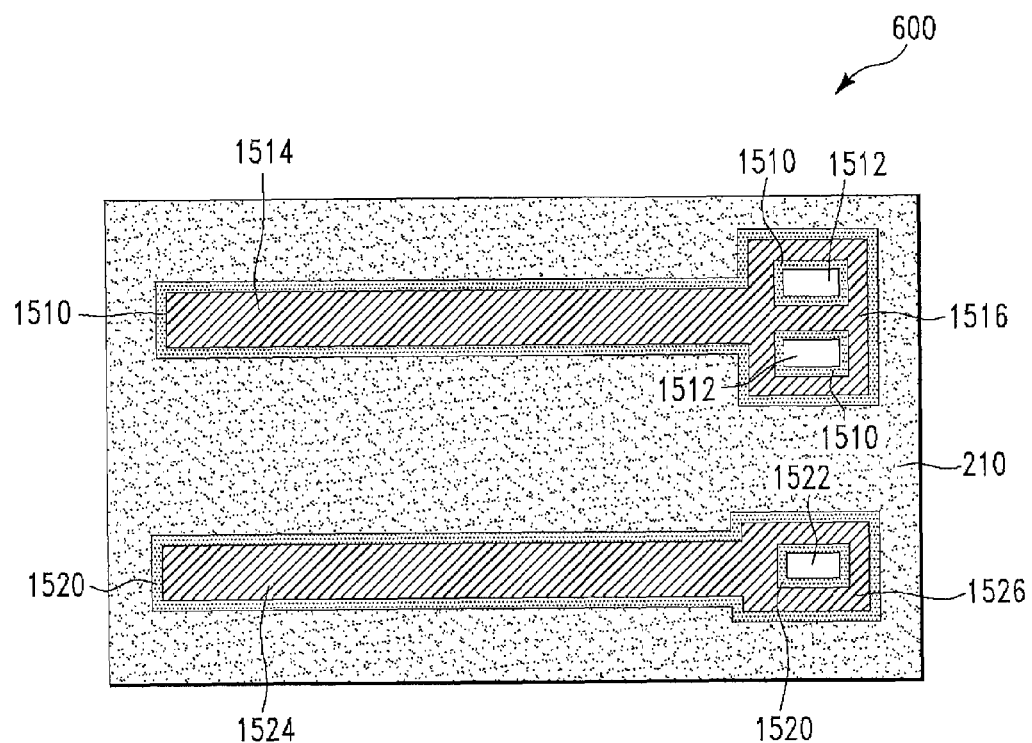
FIGS. 15A-16 illustrate a fabrication process for forming a sixth structure, in accordance with embodiments of the present invention.
Figure 15B:
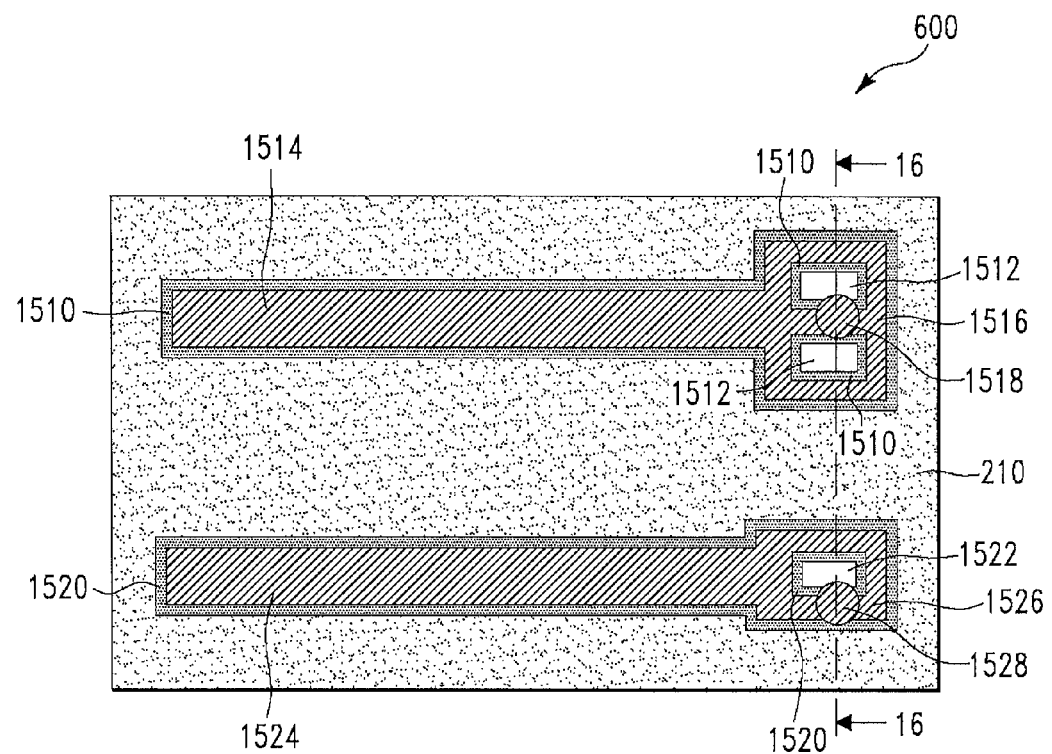
Figure 16:
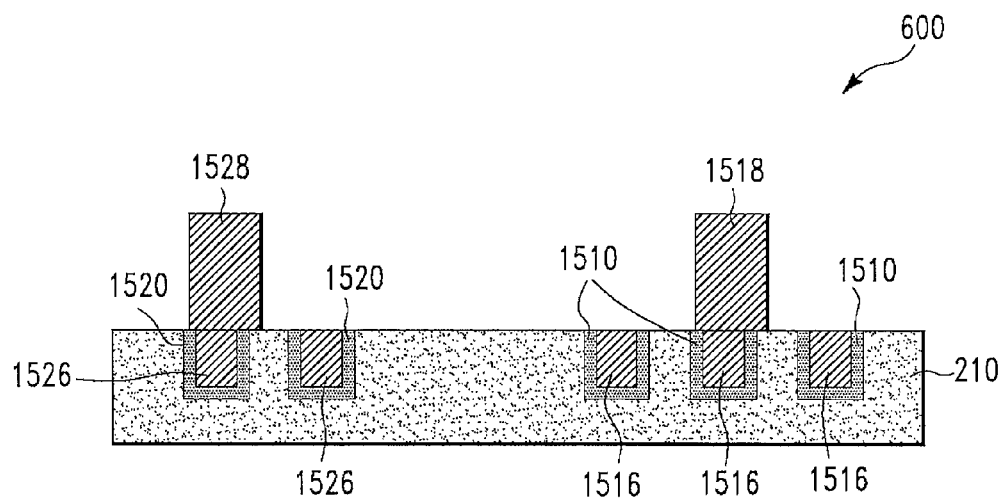

FIGS. 15A-16 illustrate a fabrication process for forming a sixth structure 600, in accordance with embodiments of the present invention. More specifically, in one embodiment, with reference to FIG. 15A, the fabrication process of the structure 600 starts with the structure 600 of FIG. 15A (top-down view). Illustratively, the structure 600 comprises an ILD layer 210, wire regions 1514 and 1524 in the ILD layer 210 wherein the wire regions 1514 and 1524 are separated from the ILD layer 210 by liner regions 1510 and 1520, respectively. In one embodiment, the structure 600 of FIG. 15A further comprises dielectric islands 1512 and 1522 wherein the dielectric islands 1512 and 1522 are separated from the wire regions 1514 and 1524 by liner regions 1510 and 1520, respectively. Illustratively, the wire regions 1514 and 1524 comprise copper and the liner regions 1510 and 1520 comprise tantalum nitride. In one embodiment, the formation of the structure 600 of FIG. 15A is similar to the formation of the structure 200 of FIG. 4. It should be noted that copper portions around the liner regions 1510 and 1520 can be referred to as redundant conductive regions 1516 and 1526, respectively.

Next, in one embodiment, with reference to FIG. 15B, bottomless vias 1518 and 1528 are formed on top of the redundant conductive regions 1516 and 1526, respectively. Illustratively, the bottomless vias 1518 and 1528 comprise copper. In one embodiment, the bottomless vias 1518 and 1528 can be formed by a conventional method.

FIG. 16 illustrates a cross-section view of the structure 600 of FIG. 15B along a line 16-16.

As a result, the redundant conductive regions 1516 and 1526 create alternative paths for current in the wire regions 1514 and 1524.

In summary, the flux divergence nucleation points 612 and 622 (FIG. 6), the flux divergence nucleation points 814 and 824 (FIG. 9), and the flux relaxation points 1214 and 1224 (FIG. 12A) and the entire liners serve as diffusion barrier regions that prevent copper from diffusing from one copper region to another. For instance, with reference to FIG. 6, the diffusion barrier region 622 plus the entire liner 420 prevents copper from diffusing from the wire region 422 to the wire region 424 (i.e. to prevent electromigration). As a result, void fails are prevented in the wire regions 422 and 424 due to the short length effect in the wire regions 422 and 424. In other words, the wire regions 422 and 424, due to their sizes and shapes, allow for the short length effect resulting in electromigration not occurring in the wire regions 422 and 424.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
providing a first interlevel dielectric (ILD) layer; and then
forming a first electrically conductive line, a second electrically conductive line, and a diffusion barrier region in the first ILD layer,
 wherein the diffusion barrier region (i) physically isolates, (ii) electrically couples together, and (iii) are in direct physical contact with the first and second electrically conductive lines,
 wherein the first and second electrically conductive lines each comprises at least a first electrically conductive material, wherein the diffusion barrier region comprises at least a second electrically conductive material different from the first electrically conductive material, and wherein the diffusion barrier region is adapted to prevent a diffusion of the first electrically conductive material through the diffusion barrier region.

2. The method of claim 1, further comprising:

forming a second ILD layer on top of the first ILD layer after said forming the first and second electrically conductive lines and the diffusion barrier region is performed; and then forming an electrically conductive via in the second conductive ILD layer, wherein the electrically conductive via is electrically coupled to the first electrically conductive line, the second electrically conductive line, and the diffusion barrier region.

3. The method of claim 2, wherein the electrically conductive via is on top of and in direct physical contact with the diffusion barrier region.

4. The method of claim 2, wherein the electrically conductive via is on top of and in direct physical contact with the first electrically conductive line.

5. The method of claim 4, wherein the electrically conductive via comprises a first region and a second region, wherein the first region comprises the first electrically conductive material, wherein the second region comprises the second electrically conductive material, and wherein the second region (i) is in direct physical contact with the first region and the first electrically conductive line and (ii) physically isolates the first region and the first electrically conductive line.

6. The method of claim 4, wherein the electrically conductive via comprise the first electrically conductive material, and wherein the electrically conductive via does not comprise the second electrically conductive material.

7. The method of claim 1, wherein the first electrically conductive material comprises copper.

8. The method of claim 1, wherein the second electrically conductive material comprises tantalum nitride.

* * * * *